(12) United States Patent
Hyun

(10) Patent No.: US 7,576,011 B2
(45) Date of Patent: Aug. 18, 2009

(54) METHOD OF FORMING CONTACT PLUG IN SEMICONDUCTOR

(75) Inventor: Chan Sun Hyun, Icheon-si (KR)

(73) Assignee: Hynix Semiconductor Inc., Icheon-Si (KR)

( * ) Notice: Subject to any disclaimer, the term of this patent is extended or adjusted under 35 U.S.C. 154(b) by 125 days.

(21) Appl. No.: 11/747,449

(22) Filed: May 11, 2007

(65) Prior Publication Data

US 2008/0160760 A1    Jul. 3, 2008

(30) Foreign Application Priority Data

Dec. 28, 2006    (KR) ..................... 10-2006-0136286

(51) Int. Cl.
*H01L 21/302* (2006.01)
*H01L 21/461* (2006.01)
(52) U.S. Cl. .................... 438/740; 438/723; 438/751; 438/970; 257/E21.477; 257/483
(58) Field of Classification Search ................. 438/740, 438/751, 737, 735, 970, 743, 637, 634, 722, 438/736; 257/E21.477, E21.483, E21.49, 257/E21.486, E21.493
See application file for complete search history.

(56) References Cited

FOREIGN PATENT DOCUMENTS

| JP | 2003-152116 | 5/2003 |
| JP | 2006-121036 | 5/2006 |
| KR | 1020060045790 | 5/2006 |
| KR | 100632634 | 9/2006 |

OTHER PUBLICATIONS

Notice of Allowance of the Korean Patent Application No. 2006-136286.

*Primary Examiner*—Caridad M Everhart
(74) *Attorney, Agent, or Firm*—Marshall, Gerstein & Borun LLP

(57) ABSTRACT

A method of forming a contact plug in a semiconductor device includes the steps of forming a plurality of select lines and a plurality of word lines on a semiconductor substrate; forming a first etching stop layer on the select lines and the word lines; forming a second etching stop layer on the first etching stop layer; forming an insulating layer on the second etching stop layer; removing the insulating layer placed between the select lines, the second etching stop layer and the first etching stop layer to form a contact hole through which a portion of the semiconductor substrate is exposed; and filling the contact hole with conductive material to form a contact plug, and so the nitride layer is thinly formed and the high dielectric layer is then formed to form the etching stop layer. Due to the above, a layer stress caused by the nitride layer can be minimized, and it is possible to resolve a problem of exposing the semiconductor substrate caused by a damage of the etching stop layer.

15 Claims, 4 Drawing Sheets

METHOD OF FORMING CONTACT PLUG IN SEMICONDUCTOR

CROSS-REFERENCE TO RELATED APPLICATIONS

The priority of Korean Patent Application No. 10-2006-0136286, filed on Dec. 28, 2006, the contents of which are incorporated herein by reference in their entirety, is claimed.

BACKGROUND OF THE INVENTION

The invention relates to a method of forming a contact plug in a semiconductor device and, more particularly, relates to a method of forming a contact plug in a semiconductor device being capable of forming a contact plug through a self align contact (SAC) process.

A flash memory device is a non-volatile memory device which can store data when electric power is interrupted. The flash memory device is characterized in that electrical program/erase operations can be performed and a refresh function for rewriting the data is not required. Such flash memory devices are classified as NOR flash memory devices and NAND flash memory devices according to the structure of the cell and an operation condition. In the NOR flash memory device, a plurality of word lines are connected to each other in parallel so that program and erase operations for the optional address can be performed, and so the NOR flash memory device is mainly employed in application fields requiring high operation speed. On the other hand, the NAND flash memory device has a structure in which a plurality of memory cell transistors are connected to each other in series to form one string and one string is connected to a source and a drain, such NAND flash memory devices are mainly employed in the high integrated data storage application field.

As memory devices become more highly integrated and microminiaturized, a process margin is reduced so that it is gradually difficult to form a source/drain contact plug connecting a semiconductor substrate on which source/drain regions are formed and a metal wire,

SUMMARY OF THE INVENTION

In the invention, in order to form an etching stop layer utilized when a source/drain contact plug is formed through a self alignment contact process, a nitride layer is thinly formed and a high dielectric layer is then formed, so the invention can minimize a layer stress caused by the nitride layer and resolve a problem of exposing the semiconductor substrate caused by a damage of the etching stop layer.

The method of forming a contact plug in a semiconductor device according to the invention may include the steps of forming a plurality of select lines and a plurality of word lines on a semiconductor substrate; forming a first etching stop layer on the select lines and the word lines; forming a second etching stop layer on the first etching stop layer, the second etching stop layer having an etching selectivity which differs from that of the first etching stop layer; forming a first insulating layer on the second etching stop layer; removing the first insulating layer placed between the select lines; removing the second etching stop layer placed between the select lines; removing the first etching stop layer placed between the select lines to form a contact hole through which a portion of the semiconductor substrate is exposed; and filling the contact hole with conductive material to form a contact plug.

The first etching stop layer is preferably formed of a nitride layer. The nitride layer is preferably formed in a thickness of 100 Å to 300 Å.

The second etching stop layer is preferably formed of a high dielectric layer. The high dielectric layer is preferably formed in a thickness of 100 Å to 300 Å. The high dielectric layer is preferably formed from one of $HfO_2$, $Al_2O_3$, and $ZrO_2$.

The second etching stop layer is preferably removed by a dry etching process. The dry etching process preferably utilizes $BCl_3$ gas. The dry etching process is preferably performed under the condition that the high dielectric layer is more etched than the nitride layer. The dry etching process is preferably performed under the condition that the etching selection ratio between the nitride layer and the high dielectric layer is 1:2 to 1:100.

The first etching stop layer is preferably removed by a dry etching process. The dry etching process preferably utilizes $CHF_3$ gas or Ar gas.

The method of the invention may further include the step of performing an ion implanting process between the select lines to form a junction area after a plurality of select lines and a plurality of word lines are formed on the semiconductor substrate. The method of the invention may further include the step of forming a second insulating layer on an entire structure of the semiconductor substrate after the word line and the select line are formed. The second insulating layer is preferably etched to form an insulating layer spacer on a side wall of the select line.

BRIEF DESCRIPTION OF THE DRAWINGS

The figures and other features and advantages of the invention will become readily apparent by reference to the following detailed description when considered in conjunction with the accompanying drawings wherein.

DESCRIPTION OF SPECIFIC EMBODIMENTS

Hereinafter, an embodiment of the invention is explained in more detail with reference to the accompanying drawings.

However, the invention is not limited the embodiment described below, and the embodiments of the invention may be variously modified, and the scope of the invention is not limited to the embodiments described below. Also, the embodiment is provided for illustrating more completely the invention to those skilled in the art.

FIG. 1A to FIG. 1G are sectional views of a semiconductor device illustrating a method of forming a contact plug in a semiconductor device according to the invention.

Figure 1A:
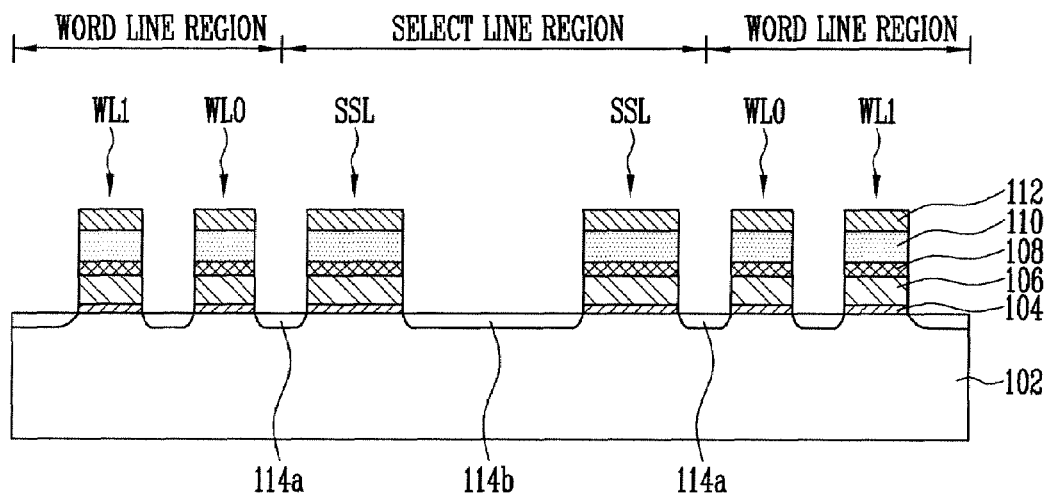
FIG. 1A to FIG. 1G are sectional views of a semiconductor device illustrating a method of forming a contact plug in a semiconductor device according to the invention.

Referring to FIG. 1A, a plurality of source select lines SSL, a plurality of word lines WL0 and WL1, and a plurality of drain select lines are formed in parallel at certain intervals on a semiconductor substrate 102 including word line regions and a select line region. In general, 16, 32, or 64 word lines are formed between the source select line and the drain select line. However, the drawings show that only two word lines are disposed on each word line region. In addition, the drain select line is omitted and only the source select lines are shown in the drawings. Hereinafter, the source select line and the drain select line are together referred to as "select line."

On the other hand, the word line and the select line have the stack layer structure including a gate insulating layer 104, a conductive layer 106 for a floating gate, a dielectric layer 108, a conductive layer 110 for a control gate, and a conductive layer 112. Preferably, the conductive layer 106 for the floating gate and the conductive layer 110 for the control gate can be formed by utilizing polysilicon, the dielectric layer 108 may have the ONO (oxide/nitride/oxide) structure constituted by stacking an oxide layer, a nitride layer, and an oxide layer. Also, the conductive layer 112 may be formed of a metal silicide layer.

In addition, the conductive layer 106 for the floating gate and the conductive layer 110 for the control gate of the select line are electrically connected to each other through a predetermined process. However, this process is not illustrated the electrical connection portion in the drawing. The process for connecting the conductive layers 106 and 110 is described in more detail. When the word line and the select line are formed, the conductive layer 106 for the floating gate and the conductive layer 110 for the control gate of the select line can be electrically connected to each other by removing a dielectric layer in the select line region. As another method, a plug may be formed on the select line in a subsequent process to connect electrically the conductive layer 106 for the floating gate to the conductive layer 110 for the control gate of the select line.

In addition, in order to reduce an etching damage generated when an etching process is performed for forming the gate line, a re-oxidation process is carried out. Also, a buffer layer (not shown) is formed for preventing the damage from being generated in a subsequent ion implanting process. Preferably, the buffer is formed of an oxide layer or a nitride layer, or has a stack structure of oxide layer/nitride layer. Subsequently, an ion implanting process is performed on an exposed portion of the semiconductor substrate 102 to form junction areas 114a and 114b. Here, the junction area 114b formed between the source select lines SSL acts as a common source, and the junction area (not shown) formed between the drain select lines acts as a drain to be connected to a bit line in the subsequent process.

Figure 1B:
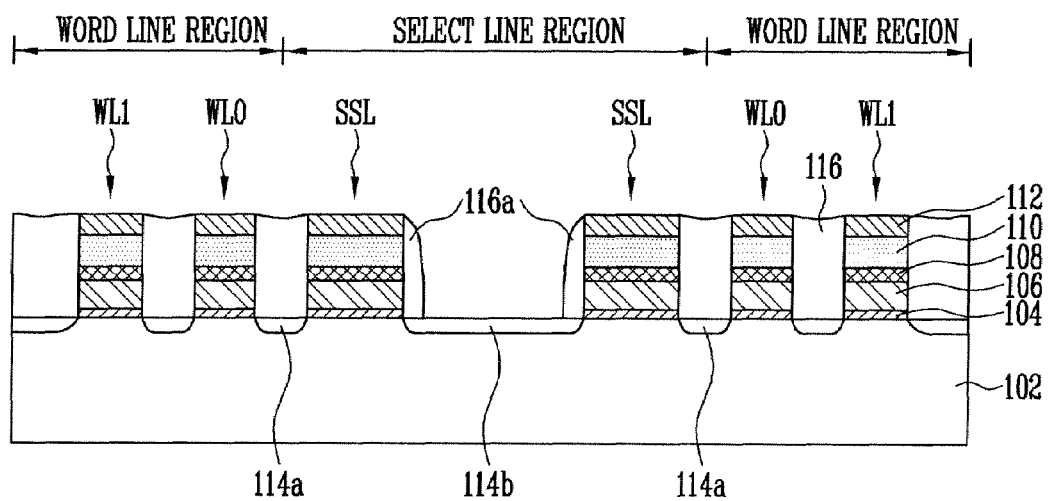

Referring to FIG. 1B, an insulating layer 116 is formed on an entire structure of the semiconductor substrate 102 including the word line and the select lines. Preferably, the insulating layer 116 is formed such the word line and the select line are filled with the insulating layer. Subsequently, an etching process is performed on an upper side of the insulating layer 116 to remove a portion of the insulating layer 116 formed between the select lines of the semiconductor substrate 102. With this, the junction area 114b formed between the select lines is exposed, and insulating layer spacers 116a are formed on side walls of the source select line and the drain select line. Further, since a width between the word lines and a width between the select line and the word line are narrow, the insulating layer 116 remains, and so spaces between the word lines and between the select line and the word line are filled with the insulating layer 116.

Figure 1C:
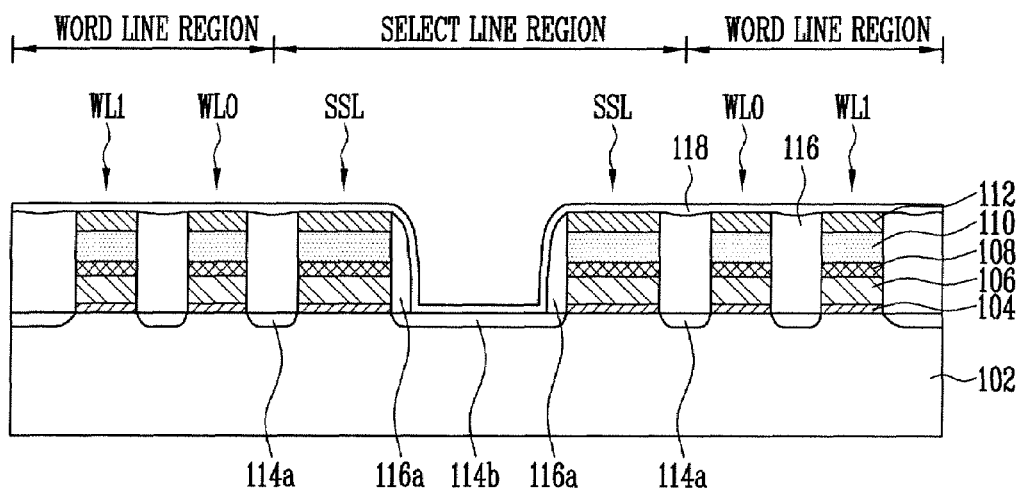

Referring to FIG. 1C, a nitride layer 118 is formed on an entire structure of the semiconductor substrate 100 including the insulating layer 116. The nitride layer 118 prevents a damage of cell which may be generated during a subsequent etching process for forming a contact hole, protects a cell against ion during an ion implanting process and may be utilized as an etching stop layer during a subsequent planarization process. The nitride layer 118 is also utilized for a self alignment contact process which is performed for preventing the insulating layer spacer 116a formed on the side wall of the select line from etching although an alignment error is generated when a contact hole is formed on the junction area 114a in a subsequent process.

On the other hand, the nitride layer 118 has a thickness (for example, 200 Å to 300 Å) which is similar to that of the ordinary nitride layer in the semiconductor device or has a thickness (for example, 100 Å to 300 Å) which is smaller than that of the ordinary nitride layer. With this, the layer stress caused by the nitride layer 118 is minimized so that a cycling threshold voltage fluctuation effect can be minimized. The cycling threshold voltage fluctuation effect implies that a threshold voltage of the memory cell is fluctuated by the repetitive F-N tunneling phenomenon caused by a process in which a program operation and an erase operation are repeatedly performed and a cell malfunctions.

Figure 1D:
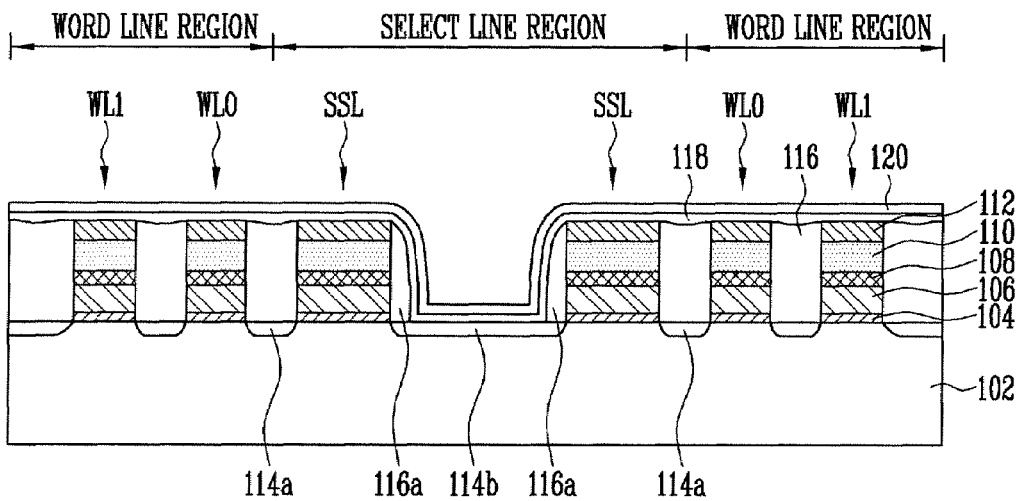

Referring to FIG. 1D, a high dielectric layer 120 is formed on the nitride layer 118. The high dielectric layer 120 has the etching selection ratio that differs from that of the nitride layer 118 and is not removed easily through the general etching process, and so the high dielectric layer 120 is suitable for performing a function of the etching stop layer. Accordingly, although a thickness of the nitride layer 118 formed in the above-mentioned process is thin and the nitride 118 is damaged in the etching process, the high dielectric layer 120 can complement a function of the etching stop layer. The above process allows the nitride layer 118 to be removed during a subsequent etching process, and so the problem of damaging the semiconductor substrate 102 caused by an exposure of the semiconductor substrate 102 can be resolved. The high dielectric layer 120 can be formed in a thickness of 100 Å to 300 Å through a process utilizing $HfO_2$, $Al_2O_3$, $ZrO_2$, and the like.

Figure 1E:
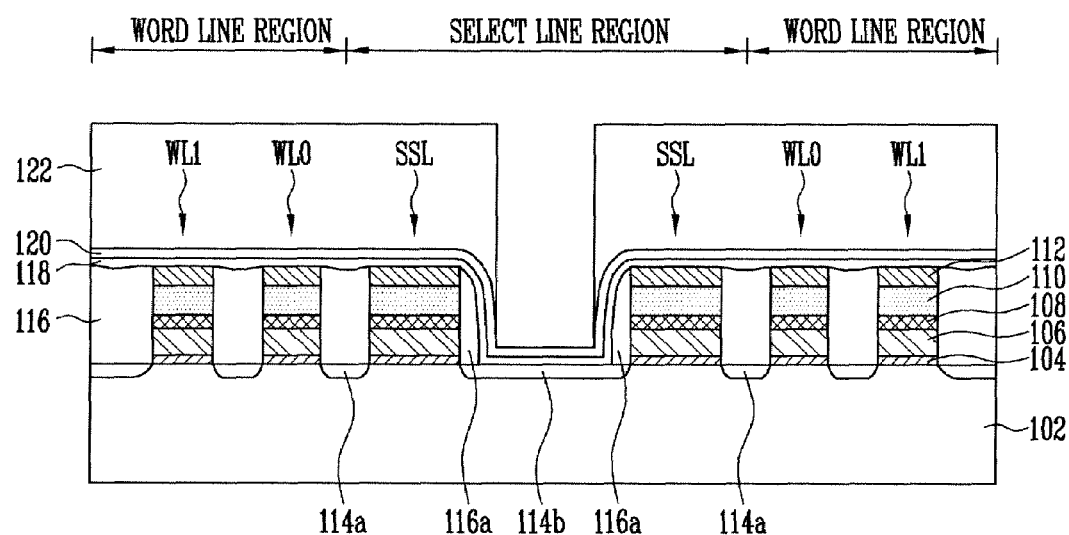

Referring to FIG. 1E, an insulating layer 122 is formed on the entire structure of the semiconductor substrate 102 including the high electric layer 120. Preferably, the insulating layer 122 is formed of an oxide layer. And, a portion of the insulating layer 122 to form a contact hole, the high dielectric layer 120 formed on the junction area 114b is exposed through the contact hole. The insulating layer 122 may be removed through a dry etching process utilizing ordinary gas such as CF4, CHF3 and the like which are capable of removing the oxide layer. At this time, as described above, the high dielectric layer 120 acts as the etching stop layer.

Figure 1F:
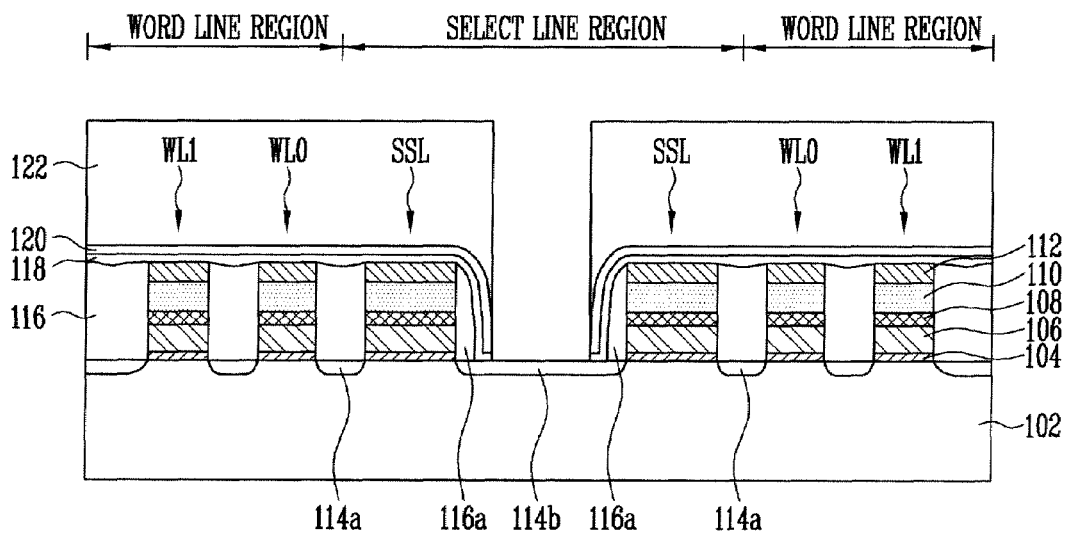

Referring to FIG. 1F, the exposed high dielectric layer 120 is removed to expose a portion of the nitride layer 118 formed below the high dielectric layer 120. The high dielectric layer 120 can be removed through a dry etching process utilizing $BCl_3$ gas, and the nitride layer 118 may function as the etching stop layer. For removing the high dielectric layer, the etching process can be performed under the condition that the high dielectric layer is etched more than the nitride (for example, an etching selectivity between the nitride layer and the high dielectric layer of 1:2 to 1:100).

Subsequently, the exposed nitride layer 118 is removed to expose the junction area 114b formed below the nitride layer. The nitride layer 118 can be removed through a dry etching process utilizing $CHF_3$ gas or Ar gas.

Figure 1G:
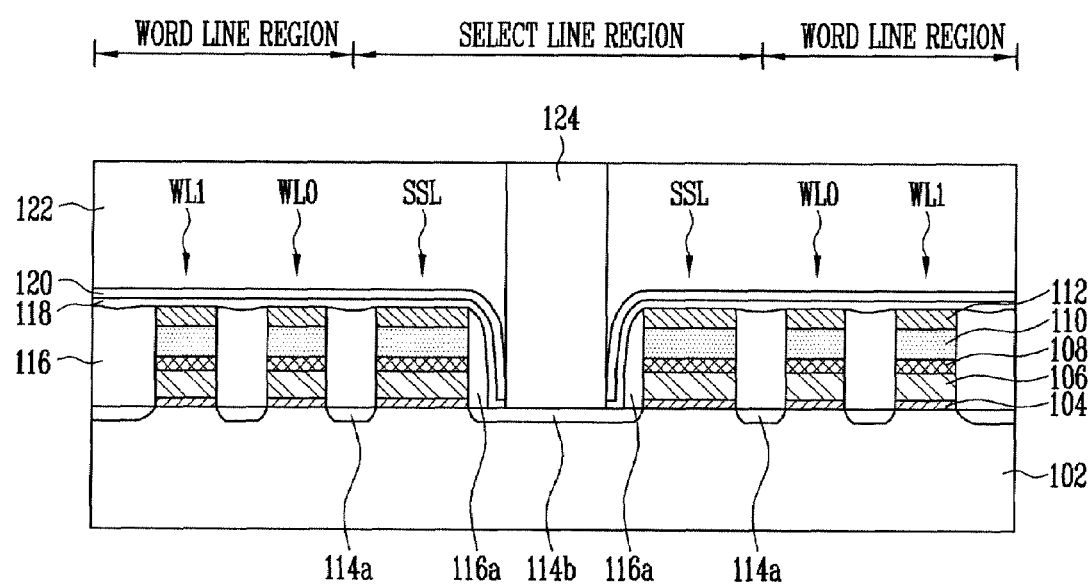

Referring to FIG. 1G, the contact hole is filled with the conductive material, for example, metal material to form a contact plug 124.

In accordance with the method of forming the contact plug in the semiconductor device according to the invention, the nitride layer is thinly formed and the high dielectric layer is then formed to form the etching stop layer, and so a layer stress caused by the nitride layer can be minimized, and it is possible to resolve a problem of exposing the semiconductor substrate caused by a damage of the etching stop layer.

Although embodiments have been described with reference to a number of illustrative embodiments thereof, numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings, and the appended claims. In addition to variations and modifications in the component parts and/or arrangements, alternative uses will also be apparent to those skilled in the art.

What is claimed is:

1. A method of forming a contact plug in a semiconductor device, comprising:

forming a plurality of select lines and a plurality of word lines on a semiconductor substrate;

forming a first etching stop layer on the select lines and the word lines;

forming a second etching stop layer on the first etching stop layer, the second etching stop layer having an etching selectivity which differs from that of the first stop etching layer, wherein the first and second etching stop layers comprise different materials;

forming a first insulating layer on the second etching stop layer;

removing the first insulating layer placed between the select lines;

removing the second etching stop layer placed between the select lines;

removing the first etching stop layer placed between the select lines to form a contact hole through which a portion of the semiconductor substrate is exposed; and filling the contact hole with conductive material to form a contact plug.

2. The method of forming a contact plug in the semiconductor device according to claim 1, further comprising performing an ion implanting process between the select lines to form a junction area after a plurality of select lines and a plurality of word lines are formed on the semiconductor substrate.

3. The method of forming a contact plug in the semiconductor device according to claim 1, wherein the first etching stop layer comprises a nitride layer.

4. The method of forming a contact plug in the semiconductor device according to claim 3, comprising forming the nitride layer in a thickness of 100 Å to 300 Å.

5. The method of forming a contact plug in the semiconductor device according to claim 1, wherein the second etching stop layer comprises a high dielectric layer.

6. The method of forming a contact plug in the semiconductor device according to claim 5, comprising forming the high dielectric layer a thickness of 100 Å to 300 Å.

7. The method of forming a contact plug in the semiconductor device according to claim 5, wherein the high dielectric layer comprises one of $HfO_2$, $Al_2O_3$, and $ZrO_2$.

8. The method of forming a contact plug in the semiconductor device according to claim 1, comprising removing the second etching stop layer by a dry etching process.

9. The method of forming a contact plug in the semiconductor device according to claim 8, wherein the dry etching process utilizes $BCl_3$ gas.

10. The method of forming a contact plug in the semiconductor device according to claim 8, comprising performing the dry etching process under the condition that the high dielectric layer is more etched than the nitride layer.

11. The method of forming a contact plug in the semiconductor device according to claim 10, comprising performing the dry etching process under the condition that the etching selectivity between the nitride layer and the high dielectric layer is 1:2 to 1:100.

12. The method of forming a contact plug in the semiconductor device according to claim 1, comprising removing the first etching stop layer by a dry etching process.

13. The method of forming a contact plug in the semiconductor device according to claim 12, wherein the dry etching process utilizes $CHF_3$ gas or Ar gas.

14. The method of forming a contact plug in the semiconductor device according to claim 1, further comprising forming a second insulating layer on an entire structure of the semiconductor substrate after forming the word line and the select line.

15. The method of forming a contact plug in the semiconductor device according to claim 14, comprising etching the second insulating layer to form an insulating layer spacer on a side wall of the select line.

* * * * *